United States Patent
Zarubinsky et al.

(10) Patent No.: US 6,257,756 B1
(45) Date of Patent: Jul. 10, 2001

(54) APPARATUS AND METHOD FOR IMPLEMENTING VITERBI BUTTERFLIES

(75) Inventors: Michael Zarubinsky, Jerusalem; Yoram Salant, Rosh-Haain; Natan Baron, Oranit, all of (IL)

(73) Assignee: Motorola, Inc., Schaumburg, IL (US)

( * ) Notice: Subject to any disclaimer, the term of this patent is extended or adjusted under 35 U.S.C. 154(b) by 163 days.

(21) Appl. No.: 08/895,067

(22) Filed: Jul. 16, 1997

(51) Int. Cl.[7] .................................................. G06F 11/10
(52) U.S. Cl. ....................... 371/43.7; 371/43.3; 371/43.4; 371/43.6; 371/43.8; 371/45; 371/46; 375/200; 375/260; 375/285; 375/341; 341/107
(58) Field of Search .......................... 371/43.7, 46, 43.4, 371/43.8, 43.3, 43.6, 45; 375/200, 285, 260, 322, 341; 341/107, 78, 94, 144, 50, 51, 81, 106, 95

(56) References Cited

U.S. PATENT DOCUMENTS 5,027,374  6/1991  Rossman ................................. 375/94
5,742,621 * 4/1998  Amon et al. ............................ 371/43

FOREIGN PATENT DOCUMENTS 0677928    10/1995  (EP) .
0 677 928 A1 * 10/1995  (EP) .

OTHER PUBLICATIONS

"DSP 56300—24-bit digital signal processor family manual", second printing, Motorola, Inc., Semiconductor Products Sector, Austin, pp. 3–1 to 3–6.

"Technical Developments", vol. 30, Motorola, Inc. Schaumburg, Illinois 60196, pp. 6–68.

"Error Control Coding, Fundamentals and Applications", Shu Lin, Daniel J. Costello, Jr., Prentice Hall, Inc. Englewood Cliffs, NewJersey 07632, pp. 315–322 and pp. 337–341 and pp. 345–346.

Texas Instruments/France (TI) Preliminary Data, 3.5 CALU Compare Select Store Unit (CSSU), TMS320C5XX CPU User's Guide, Rev. 1.22, pp. 15–18.

Motorola MSIL, Nov. 7, 1996, Chapter 6, "Convolutional Code Structure and Viterbi Decoding", pp. 227–237.

Mallet et al., "Hardware architecture modelling using an object–oriented method", IEEE., Euromicro Conference,. Proceedings. 24th Vol.: 1, pp.: 147–153 vol. 1, 1998.

* cited by examiner

*Primary Examiner*—Reba I. Elmore
*Assistant Examiner*—McDieunel Marc

(57) ABSTRACT

The Viterbi algorithm (20) is performed with a reduced number of calculations when the comparing step (C, 80, 50) is anticipated before the selecting (S, 62, 64, 66, 68) and adding steps (A, 74, 76). During comparing (C), selection decisions (e.g., D (i)) are obtained by analyzing pairs of old path metrics (e.g., P (2i, j–1) at 91, P (2i+1, j–1) at 92) by subtracting and multiplying the path metrics with branch metrics (e.g., B (i, j) at 95) and combining intermediate sign (e.g., SP, SB, SΔ) by e.g., and-logic (50). Selecting decisions (e.g., D (i/2, j+1), D (i/2+N/2, j+1) and new path metrics (e.g., P (i, j), P (i+12, j) are continuously stored and updated.

19 Claims, 11 Drawing Sheets

APPARATUS AND METHOD FOR IMPLEMENTING VITERBI BUTTERFLIES

FIELD OF THE INVENTION

This invention relates to digital communications, and more particularly, to error correction techniques using the Viterbi algorithm.

BACKGROUND OF THE INVENTION

A primary goal in digital communications is the transmission of data in error-free form. During transmission, the data is subjected to noise which may cause errors in the received data. To improve the reliability of data transmission, one of a variety of possible error correction techniques is commonly used. For example, a known error correction technique is convolutional coding. This technique provides an effective error correction capability but requires sophisticated decoding techniques. An optional solution for decoding convolutional codes is credited to Andrew Viterbi and is well known as the Viterbi algorithm.

The Viterbi algorithm is a recursive solution to the problem of estimating the state sequence of a discrete-time finite-state Markov process observed in memory-less noise. Viterbi decoding is not restricted to convolutional codes, but can be applied to other sequence estimation problems such as channel equalizers. Decoding of convolutional codes requires making probability decisions based on a sequence of received bits rather than on an individual bit-by-bit basis. The basic operation of the Viterbi decoder is to select the path through a trellis, in the presence of noise, that represents the most likely sequence that was generated by a convolutional encoder.

The Viterbi algorithm makes use of the recurrent properties of convolutional codes to provide an efficient solution to this problem. At each symbol period the algorithm generates a metric, a measure of probability, for each branch. The best path of each state is then determined by examining the accumulated metrics from all paths entering the state and selecting the one with the best metric. The other paths are discarded. Therefore, paths with errors will accumulate lower metrics and therefore be discarded leaving only the path that represents the sequence which was most likely generated by the encoder.

To implement the Viterbi algorithm, a plurality of add/compare/select (ACS) operations must be performed to calculate the best path to each state. In today's central processing unit (CPU) architectures which implement the Viterbi algorithm, sequential processing is utilized to perform the ACS operations. In a CPU approach, a plurality of sequential memory fetches, addition, storage and comparison operations must be executed. The sequential operation limits data throughput due to the high number of instructions needed per symbol or data bit.

Each path or branch has a unique value or metric which is represented by a positive or negative multi-bit binary value. Each path metric P and branch metric B is defined as a measure of distance determined by some form of comparison between a received symbol and a corresponding path or branch in a trellis. As used herein, the term pair "old" and "new" are convenient abbreviations to distinguish successive time points j−1, j, j+1, such as, for example, "old"="j−1" and "new"="j" or, for example, "old"="j" and new="j+1". Indices i and j can be combined with integer numbers by addition ("+"), subtraction ("−"), multiplication ("*"), and division ("/"). For convenience, the multiplication symbol "*" can be left out. For example, 2i with i=2 equals 2*2=4. Relations of the type "a>b" and "a<b" have the logical values true (e.g., for 3>2) or false (e.g., for 3<2). The calculation operation for path metrics P and branch metrics B is not relevant to the present invention and will not be further discussed since metric calculation is well documented in existing literature.

FIG. 1 illustrates a prior art example of a trellis diagram for an N=16 state code. Blocks 41, 42, and 43 indicate first, second and third pluralities of path metrics {P (n, j−1) }, {P (n, j)} and {P (n, j+1)} (n=0 to N−1=15) for successive time points j−1, j, and j+1, respectively. Pluralities are illustrated by { }. Indices n are intended to be cyclical, for example, 8+8=16 is considered as 0; 8+9=1 and so on. For simplicity, indices j−1, j, and j+1 are not shown inside the blocks. N is the number of possible states for a convolutional code with K coefficients and is generally $N=2^{K-1}$. Index n is also given as 2i, 2i+1, 2i+2 and so on for P (n, j−1) (block 41), as i, i+1 and so on for P (n, j) (block 42), and as i/2, i/2+1 and so on for P (n, j) (block 43). Even index i goes from 0 to N−2. Lines between blocks 41, 42 and 43 indicate the transitions of path metrics P (j−1) to P (j) and to P (j+1). In a representative example, butterfly 44 (bold lines) between block 41 and 42, symbolizes the transition of old path metrics P (j−1) to new path metrics P (j). For convenience of explanation for i=2, encircled reference numbers 91–95 point to P (2i, j−1)=P (4, j−1), P (2i+1, j−1)=P (5, j−1) of block 41, to P (i, j)=P (2, j), P (i+N/2, j)=P (10, j) of block 42, and to a branch metric B (i, j), respectively. N/2 butterflies (e.g., 8) are needed to transform {P (n, j−1)} to {P (n, j)}. As an example, and not intended to be limiting, the calculation for butterfly 44 will be explained in detail in connection with FIG. 2.

FIG. 2 illustrates a simplified flow diagram of a prior art calculation method for implementing the Viterbi algorithm. Old metrics P (2i, j−1) on line 91 and P (2i+1, j−1) on line 92 (cf. encircled numbers in FIG. 1) are combined with +B (i, j) at line 95 to obtain new path metrics P (i, j) at line 93 and P (i+N/2, j) at line 94. Block 11 illustrates that + B (i, j) is inverted to − B (i, j). As mentioned above, the Viterbi algorithm comprises the steps of adding (A) (blocks 12, 14, 16, and 18), comparing (C) (blocks 22 and 24), and selecting (S) (blocks 32 and 34).

(A) In the step of adding, block 12 provides P (2i, j−1)+B (i, j) at line 13, block 14 provides P (2i+1, j−1)−B (i, j) at line 15, block 16 provides P (2i, j−1)−B (i, j) at line 17, and block 18 provides P (2i+1, j−1)+B (i, j) at line 19. This resulting sums P+B are communicated to comparators 22 and 24.

(C) In the step of comparing, block 22 makes a decision D (i, j). D (i, j) becomes D (i, j)=0 for a true relation:

$$P(2i, j-1)+B(i, j) > P(2i+1, j-1)-B(i, j). \quad (1)$$

Otherwise, D (i, j) becomes D (i, j)=1 for a true relation:

$$P(2i, j-1)+B(i, j) < P(2i+1, j-1)-B(i, j). \quad (2)$$

Relations (2) and (3) differ only by the ">,<"-symbols, so that the logical values true and false are inverted. Block 24 makes decision D (i+N/2, j) which becomes D (i+N/2, j)=0 for a true relation $$P(2i, j-1)-B(i, j) > P(2i+1, j-1)+B(i,j) \quad (3)$$

The decision is D (i+N/2, j)=1 for a true relation $$P(2i, j-1)-B(i, j) < P(2i+1, j-1)+B(i,j) \quad (4)$$

Relations (4) and (5) differ also only by the ">,<"-symbols. Decisions D (i, j) and D (i+N/2, j) are communicated to blocks 32 and 34 via control lines 36 and 38, respectively.

(S) In the step of selecting, block 32 provides new $$P(i, j)=P(2i, j-1)+B(i, j) \text{ for } D(i, j)=0 \qquad (5)$$

(left side of (2) and (3)) or provides new $$P(i, j)=P(2i+1, j-1)-B(i, j) \text{ for } D(i, j)=1 \qquad (6)$$

(right side of (2) and (3)). Block 34 provides new $$P(i+N/2, j)=P(2i, j-1)-B(i, j) \text{ for } D(i+N/2, j)=0 \qquad (7)$$

(left side of (4) and (5)) and provides new $$P(i+N/2, j)=P(2i+1, j31\ 1)+B(i, j) \text{ for } D(i+N/2, j)=1 \qquad (8)$$

(right side of (4) and (5)).

It is inconvenient to have for one butterfly 44 a number of 4 add calculations (blocks 12, 14, 16, 18) in step (A) and 2 calculations (blocks 22, 24) in step (C). To transform a first plurality {P (j−1)} to a second plurality {P (j)} by 8 butterflies, 8*(4+2)=48 calculations are required.

In a communication system, Viterbi butterflies are, preferably, calculated by a digital signal processors. Such processors are usually part of communication system but have limited time resources. The calculation time increases linearly with the number of butterflies and should be reduced.

Accordingly, it is an object of the present invention to provide an improved method and ACS circuit for implementing the Viterbi decoding function in a digital communications system.

DETAILED DESCRIPTION OF A PREFERRED EMBODIMENT

According to a method of the present invention, the Viterbi algorithm is performed with a reduced number of calculations (around 33% less). The comparing step (C) is anticipated before the selecting (S) and adding steps (A). In (C), selection decisions (e.g., D (i)) are obtained by analyzing pairs of old path metrics by subtracting and multiplying the path metrics and logically combining intermediate sign (e.g., SP, SB, SΔ). Selecting decisions and new path metrics are continuously stored and updated. The method of the present invention can be implemented by, for example, a modified digital signal processor having hard-wired portions (logic circuits) for obtaining decisions in the comparing step (C). The logic circuits do not significantly contribute to calculation time, so that the total calculation time for a number of butterflies (e.g., 8) can be reduced.

Figure 3:
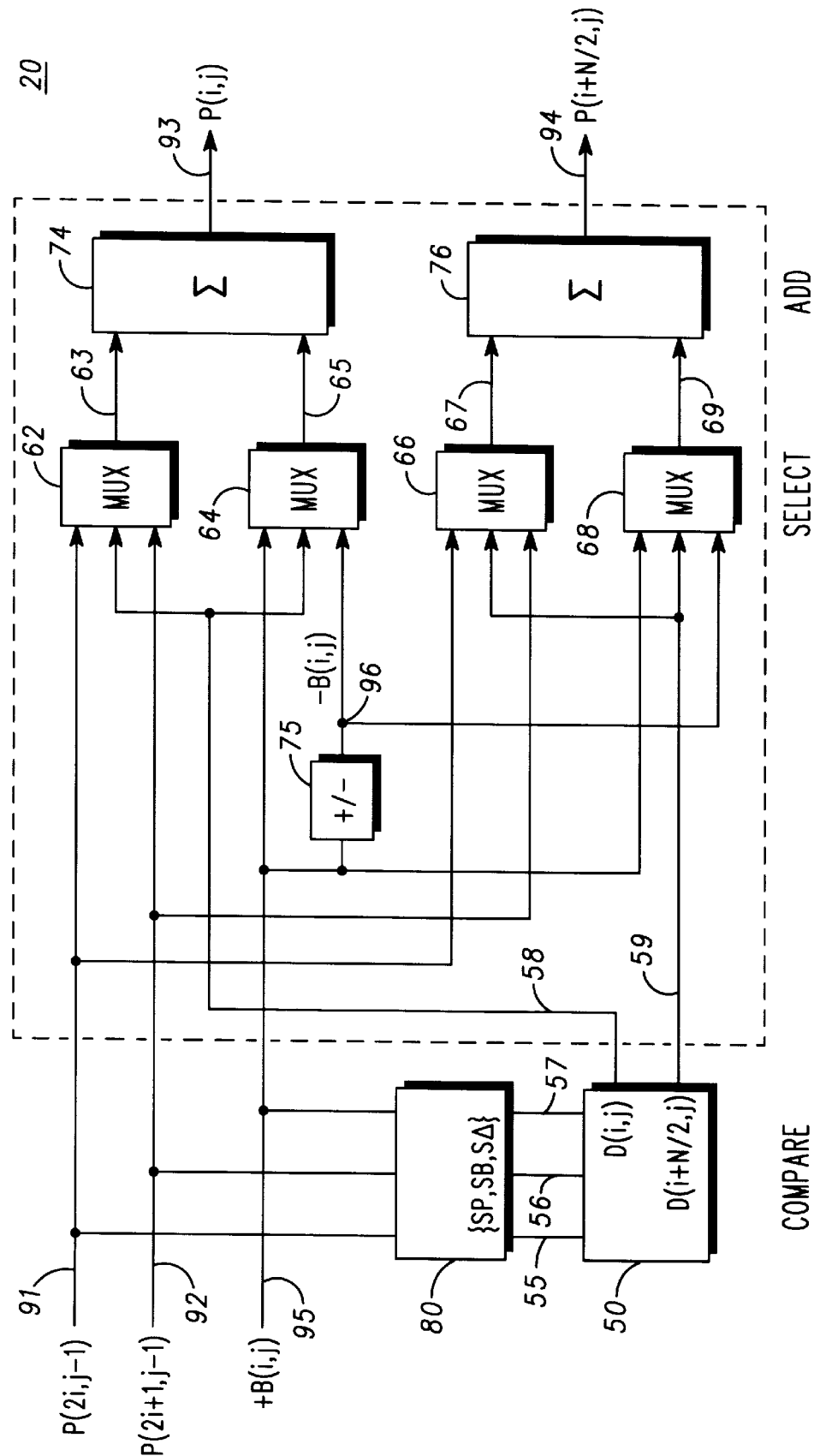
FIG. 3 illustrates a simplified flow diagram of a method of the present invention for implementing the Viterbi algorithm.

FIG. 3 illustrates a simplified flow diagram of method 20 of the present invention for implementing the Viterbi algorithm. Blocks 50, 62, 64, 66, 68, 74, 75, 76 and 80 as well as lines 55, 56, 57, 58, 59, 63, 65, 67, 69, 91, 92, 93, 94, 95 are convenient illustrations for e.g., commands for a digital processor or variables stored in a memory. A person of skill in the art is able to implement method 20 based on the following description by combinations of software and hardware.

Figure 1:
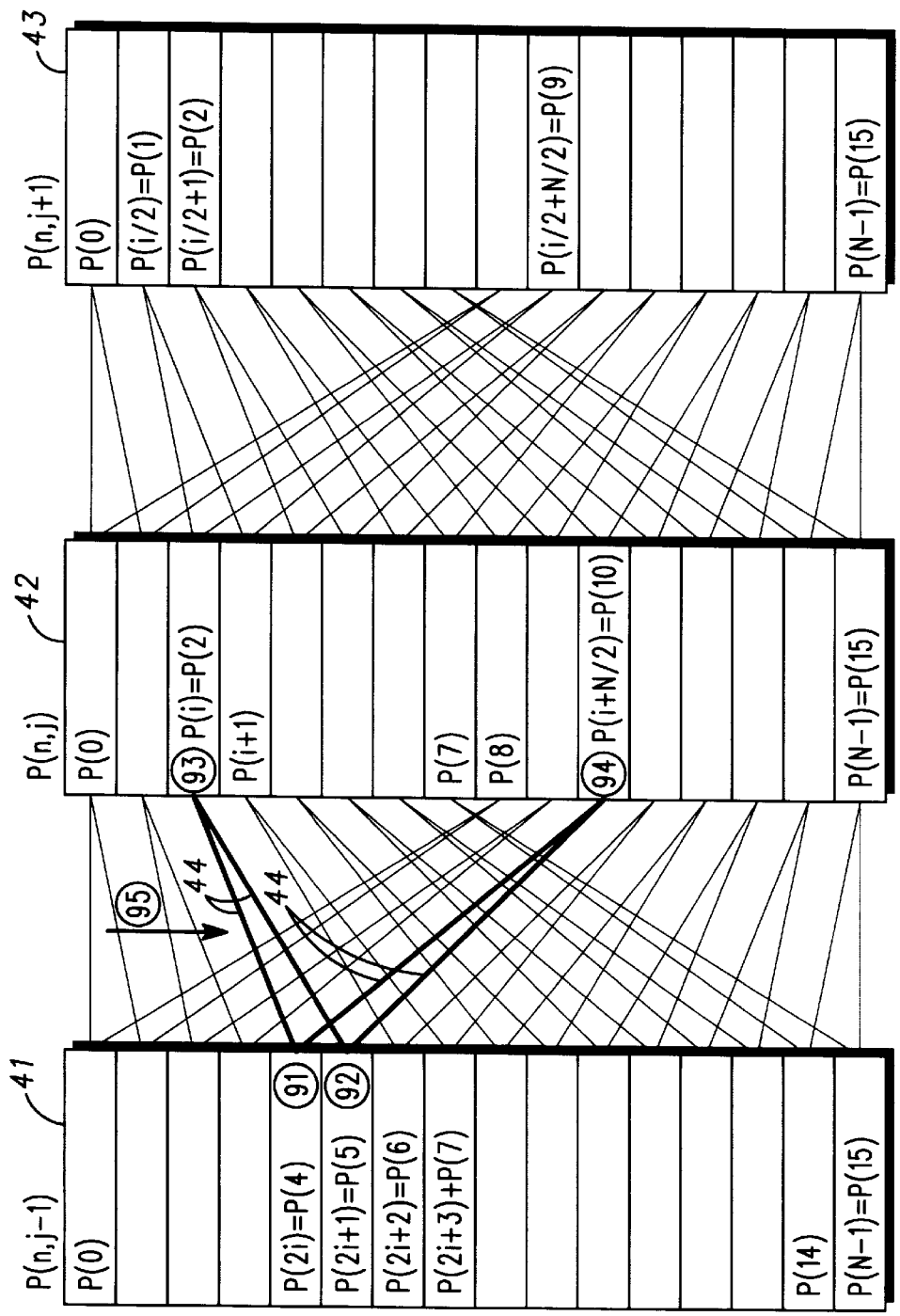
FIG. 1 illustrates an example of a trellis diagram according to the prior art.
Figure 2:
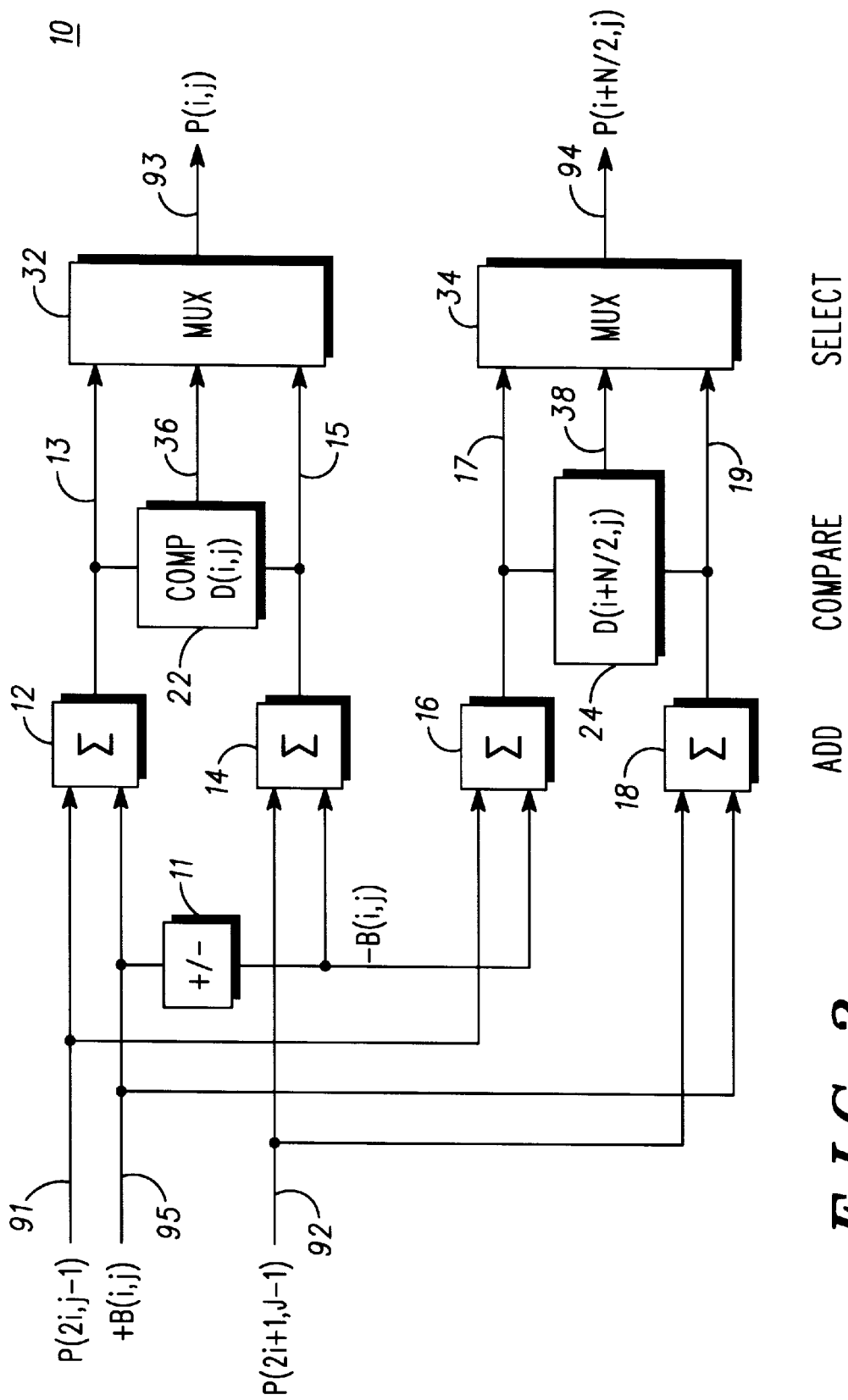
FIG. 2 illustrates a simplified flow diagram of a prior art calculation method for implementing the Viterbi algorithm.

In FIGS. 2–3, lines 91, 92, 93, 94 and 95 correspond to the encircled numbers of butterfly 44 in FIG. 1. As shown by input lines 91, 92, and 95 and output lines 93 and 94, method 20 transforms a first pair of old metrics P (2i, j−1) at line 91 and P (2i+1, j−1) at line 92 and a branch metric +B (i, j) to a second pair of new path metrics P (i, j) at line 93 and P (i+N/2, j) at line 94. Block 75 is not essential and indicates that +B (i, j) is also available in inverted form −B (i, j). Sub-steps (blocks) 80 and 50 will be explained in details in connection with FIGS. 4–5.

Method 20 comprises the steps of comparing (C) illustrated by blocks 80 and 50, selecting (S) illustrated by blocks 62, 64, 66, and 68, and adding (A) illustrated by blocks 74 and 76.

(C) During comparing, in a first sub-step, P (2i, j−1), P (2i+1, j−1), and +B (i, j) are related (block 80) to a sign vector {SP, SB, SΔ} with components SP, SB, and SΔ at lines 55, 56, and 57. In a second sub-step, SP, SB, and SΔ are related (block 50) to binary decisions D (i, j) and D (i+N/2, j) at lines 58 and 59, respectively. Details for both sub-steps are given in FIGS. 4–5.

(S) During selecting, intermediate path metric P (i, j) at line 63 is selected (block 62) from P (2i, j−1) and P (2i+1, j−1) depending on D (i, j), intermediate branch metric B1 (i, j) at line 65 is selected (block 64) from +B (i, j) and −B (i, j) depending on D (i, j), intermediate path metric P (i+N/2, j) at line 67 is selected (block 66) from P (2i, j−1) and P (2i+1, j−1) depending on D (i+N/2, j), and intermediate branch metric B2 (i, j) at line 69 is selected (block 68) from +B (i, j) and −B (i, j) depending on D (i+N/2, j).

(A) During adding, P (i, j) and B1 (i, j) are added (block 74) to P (i, j) and P (i+N/2, j) and B2 (i, j) are added (block 78) to P (i+N/2, j). For explaining details of the comparing step (C), sign vector {SP, SB, SΔ} and decisions D (i, j) and D (i+N/2, j) are derived from relations (1) to (8). Metrics M (collectively for path metric P and branch metric B) are considered as a product:

$$M=|M|*SM \qquad (9)$$

with |M| standing for the value, SM for the sign being "+1" ("plus") for positive metrics M and "−1" ("minus") for negative metrics M, and * for multiplication. Under the condition that all branch metrics B differ only by sign SB, relations (1) to (4) are rearranged. The signs SM and values |M| of B (i, j) in relations (1) to (4) are separated as defined in (9) and all terms are shifted to the left sides of the relations. The ">,<"-symbols are not changed. Also, the term P=[P (2i, j−1)−P (2i+1, j−1)] is abbreviated as SP* |P| (sign and value), and 2*B (i, j) is abbreviated as SB*2* |B| (sign, value, two times)

Relation (2) for $D(i, j)=0$ is written as: $SP^*|P|+SB^*2^*|B|>0$   (10)

Relation (3) for $D(i, j)=1$ is written as: $SP^*|P|+SB^*2^*|B|<0$   (11)

Relation (4) for $D(i+N/2, j)=0$ is written as: $SP^*|P|-SB^*2^*|B|>0$   (12)

Relation (5) for $D(i+N/2, j)=1$ is written as: $SP^*|P|-SB^*2^*|B|<0$   (13)

In relations (2) to (5) and in following relations, equality signs ("=") are not given for simplicity. In case a sum or difference of metrics equals zero, decisions D (i, j) and D (i+N/2, j) are of no importance for selecting a preferred path.

The conditions which make relations (10) to (13) true are now discussed. SP and SB each are either positive (+1) or negative (−1).

Relation (10) is always true ($D(i, j)=0$) for ($SP=+1$) and ($SB=+1$)   (14)

Relation (11) is always true ($D(i, j)=1$) for ($SP=-1$) and ($SB=-1$)   (15)

Relation (12) is always true ($D(i+N/2, j)=0$) for ($SP=+1$) and ($SB=-1$).   (16)

Relation (13) is always true ($D(i+N/2, j)=1$) for ($SP=-1$) and ($SB=+1$).   (17)

|P| can be larger or smaller than 2* |B|. Further introduced are sign SΔ=+1 for |P|>2*|B| ("larger") and SΔ=−1 for |P|<2* |B| (smaller).

Relation (10) becomes also true for ($SP=+1$) and ($SB=-1$) and ($SΔ=+1$),   (18)

and true for ($SP=-1$) and ($SB=+1$) and ($SΔ=-1$).   (19)

Relation (11) becomes also true for ($SP=-1$) and ($SB=+1$) and ($SΔ=+1$),   (20)

and true for ($SP=+1$) and ($SB=-1$) and ($SΔ=-1$).   (21)

Relation (12) becomes also true for ($SP=+1$) and ($SB=+1$) and ($SΔ=+1$),   (22)

and true for ($SP=-1$) and ($SB=-1$) and ($SΔ=-1$).   (23)

Relation (13) becomes also true for ($SP=-1$) and ($SB=-1$) and ($SΔ=+1$),   (24)

and true for ($SP=+1$) and ($SB=+1$) and ($SΔ=-1$).   (25)

In the other cases, relations, (10) to (13) are false so that the decisions are D (i, j)=1, D (i, j)=0, D (i+N/2, j)=1, and D (i+N/2, j)=0, respectively. For convenience, table 1 illustrates the decisions D (i, j) and D (i+N/2, j) for SP, SB, and SΔ being positive (+1,+) or negative (−1,−). The numbers in ( ) refer to the above mentioned conditions (14) to (25).

TABLE 1

| sign vector | | | decisions | | | |
| --- | --- | --- | --- | --- | --- | --- |
| SP | SB | SΔ | D(i, j) | | D(i + N/2, j) | |
| + | + | + | 0 | (14) | 0 | (22) |
| + | + | − | | | 1 | (25) |
| + | − | + | 0 | (18) | 0 | (16) |
| + | − | − | 1 | (21) | | |
| − | + | + | 1 | (20) | 1 | (17) |
| − | + | − | 0 | (19) | | |
| − | − | + | 1 | (15) | 1 | (24) |
| − | − | − | | | 0 | (23) |

Figure 4:
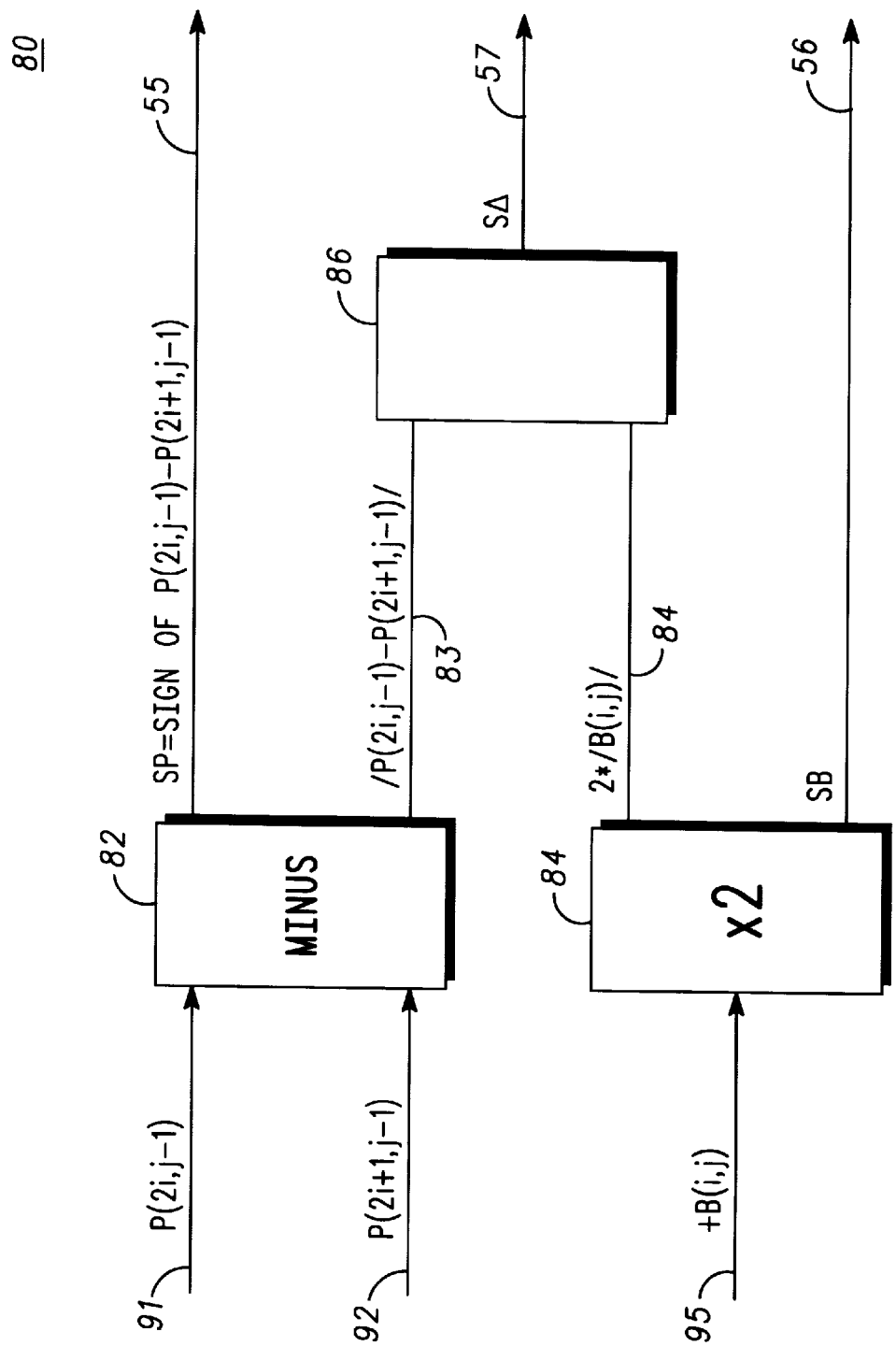
FIG. 4 illustrates a simplified flow diagram for a first sub-step of the method of FIG. 3.

FIG. 4 illustrates a simplified flow diagram for sub-step 80 of method 20 of FIG. 3. Sub-step 80 is the step of relating P (2i, j−1), P (2i+1, j−1), and +B (i, j) to the sign vector {SP, SB, SΔ}. As in FIG. 3, P (2i, j−1), P (2i+1, j−1), and +B (i, j) are symbolized by lines 91, 92, and 95, respectively; and SP, SB and SA are symbolized by lines 55, 56, and 57, respectively. As shown by block 82, the term P=P (2i, j−1)−P(2, i+1, j−1) is calculated. As mentioned above (cf. (9)), the sign SP at line 55 is obtained as SP=+1 for positive P and as SP=−1 for negative P. Also, |P| is provided (line 83). As shown by block 84, the value |B| of B (i, j) is multiplied by 2 to 2*|B|. In block 86, the sign SΔ is obtained as the sign of |P|−2*|B|. As an advantage of the present invention, it is not required to calculate the exact value of that difference. Only the sign SΔ is important.

Based on the description herein, a person of skill in the art is able to realize sub-step 80 by implementing blocks 82, 84 and 86 by, for example, logical circuitry well known in the art. For example, if B (i, j) is represented in binary form, 2*|B| can be obtained by left shifting bits.

Figure 5:
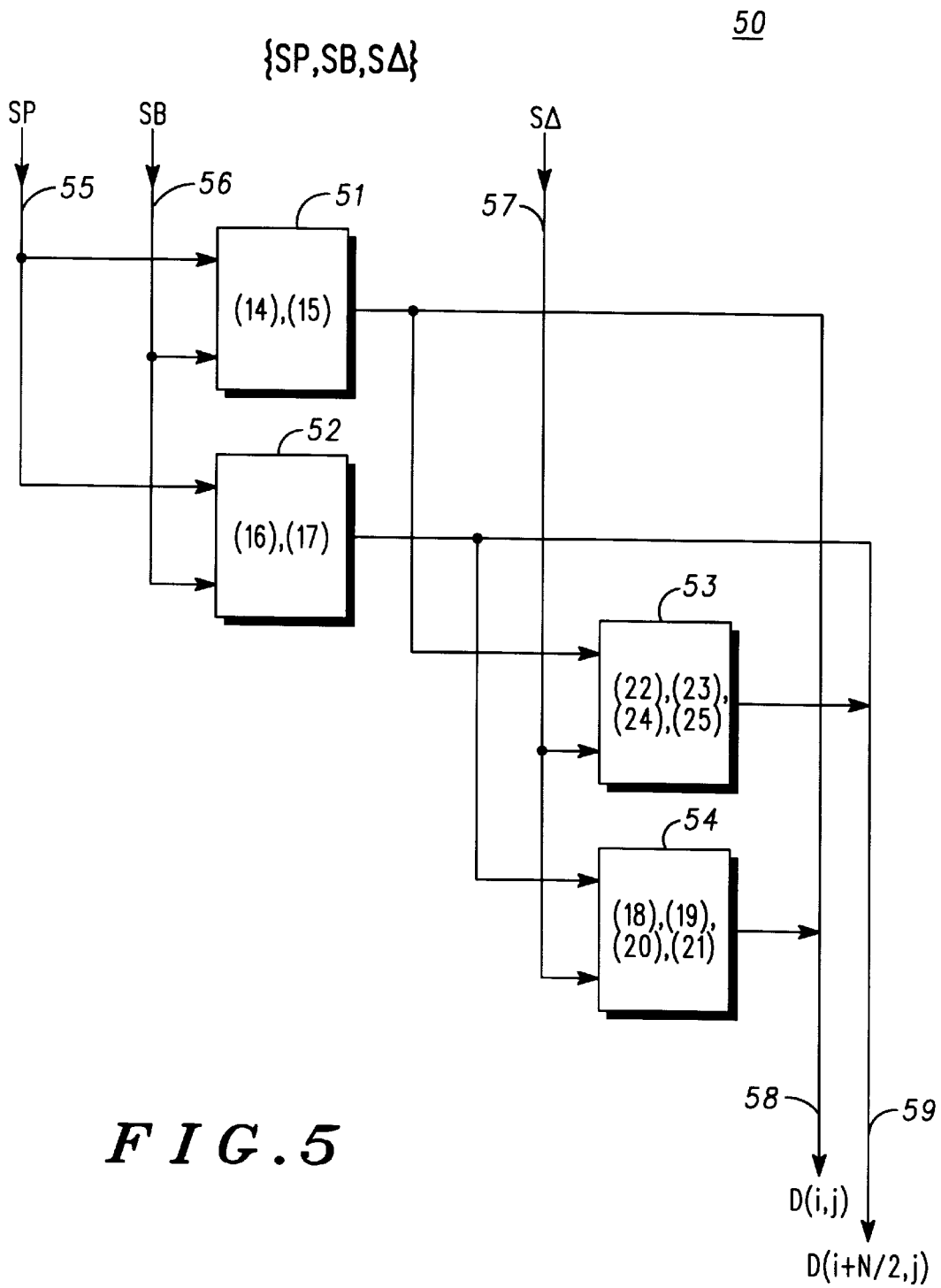
FIG. 5 illustrates a simplified flow diagram for a second sub-step of the method of FIG. 3.

FIG. 5 illustrates a simplified flow diagram for sub-step 50 of method 20 of FIG. 3. Sub-step 50 is the step of relating SP, SB, and SΔ to binary decisions D (i, j) and D (i+N/2, j). As in FIG. 3, SP, SB and SΔ are symbolized by lines 55, 56, and 57, respectively; and D (i, j) and D (i+N/2, j) are symbolized by lines 58 and 59, respectively. Blocks 51, 52, 53, and 54 illustrate the combination according to conditions (14) to (25). SP from line 55 and SB from line 56 are combined (block 51) to D (i, j) on line 58 according to (14) and (15) and combined (block 52) to D (i+N/2, j) on line 59 according to conditions (16) and (17). In block 53, D (i, j) and SΔ (line 57) are related to D (i+N/2, j) on line 59 according to (22), (23), (2) and (25). In block 54, D (i+N/2, j) and SΔ (line 57) are related to D (i, j) on line 58 according to (18), (19), (20), and (21). Based on the description herein, a person of skill in the art is able to realize sub-step 50 by implementing blocks 51, 52, 53, and 54 as logical gates, such as, for example, and-gates and inverters.

Figure 6:
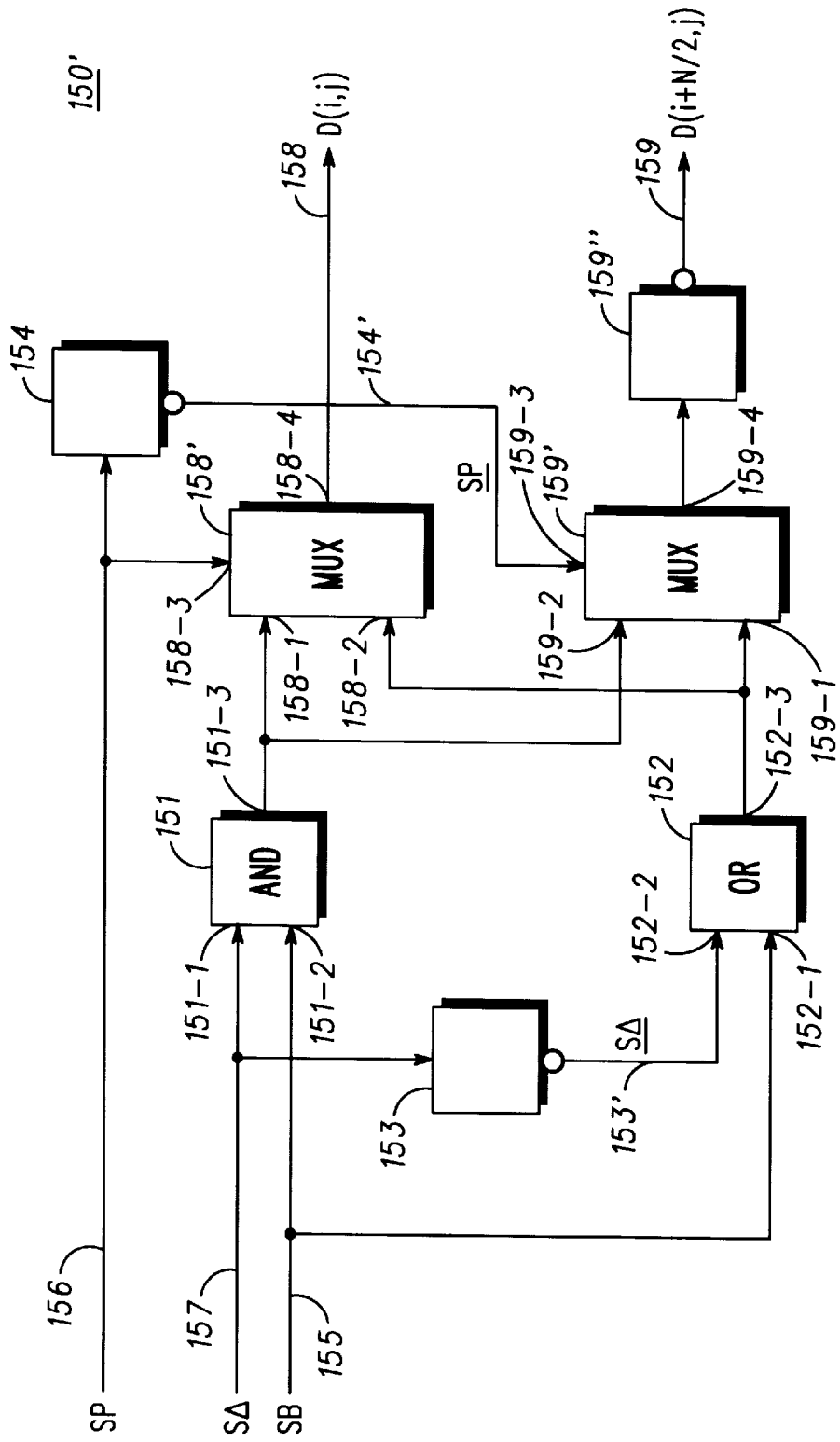
FIG. 6 illustrates a simplified block diagram of a logic circuit as an example for a preferred hardware implementation of the second sub-step of the method of FIG. 3.

FIG. 6 illustrates a simplified block diagram of logic circuit 150' as an example for a preferred hardware implementation of sub-step 50. Logic circuit 150 comprises and-gate 151, or-gate 152, multiplexer 158', multiplexer 159', inverter 153, inverter 154', and inverter 159". Logic circuit receives sign vector {SB, SP, SΔ} on lines 155–157 and provides D (i, j) and D (i+N/2, j) on lines 158 and 159, respectively. For example, signs SB, SP, SA being "−1" and decisions D (i, j), D (i+N/2,j)=1 can be represented by logical "1". Signs SB, SP, SΔ being "+1" and decisions D (i, j), D (i+N/2,j)=0 can be represented by logical "0". Line 156 (sign SP) goes to control input 158-3 of multiplexer 158' and goes to inverter 154. Inverter 154 inverts SP to SP at line 154', wherein the underscoring symbolizes logical inversion. Line 154' (SP) goes to control input 159-3 of multiplexer 159'. Line 157 (SΔ) goes to input 151-1 of and-gate 151 directly and goes to input 152-2 of gate 152 via inverter 153 (SA) and line 153'. Line 155 (SB) goes to input 151-2 of and-gate 151 and to input 152-1 of or-gate 152. Output 151-3 of and-gate 151 is coupled to input 158-1 of multiplexer 158' and to input 159-2 of multiplexer 159'. Output 152-3 of or-gate 152 goes to input 159-1 of multiplexer 159' and to input 158-2 of multiplexer 158'. Output 158-4 of multiplexer 158' goes to line 158 and provides decision D (i, j). Output 159-4 of multiplexer 159' goes to line 159 via inverter 159" which provides thereby D (i+N/2, j).

Multiplexer 158' receiving logical "0" (SP=+1) at control input 158-3 couples input 158-1 (SA and SB) to output 158-4 (D (i, j)). Otherwise, if multiplexer 158' receives logical "1" (SP=−1), than input 158-2 (SB or SΔ) is connected to output 158-4. Multiplexer 159' receiving logical "0" (SP=−1, SP=+1) at control input 159-3 couples input 159-1 (SB or SΔ) to output 159-4 (D (i+N/2, j)). Otherwise, if multiplexer 159' receives logical "1" (SP=+1) at control input 159-3, than input 159-2 (SΔ and SB) is coupled to output 159-4.

Method 20 of the present invention (FIG. 3) is compared to prior art method 10 of FIG. 2. The number of time consuming calculations of FIG. 1 (blocks 12, 14, 16, 18, 22, 24) and FIGS. 3–5 (blocks 74, 76, 82, 86) is reduced from 6 to 4 for one butterfly 44 (from 48 to 32 for 8 butterflies).

Method 20 for calculating representative butterfly 44 has been described in connection with FIGS. 2–5. By reference to a preferred embodiment of the present invention it is now explained how the pluralities {P (n, j−1)}, { P (n, j)} and {P (n, j+1)} are cyclically transferred. The flow diagram representations of FIGS. 2–5 and the use of logic circuit 150' are further illustrated by FIG. 7 showing apparatus 100 and FIG. 8 showing method 200.

Figure 7:
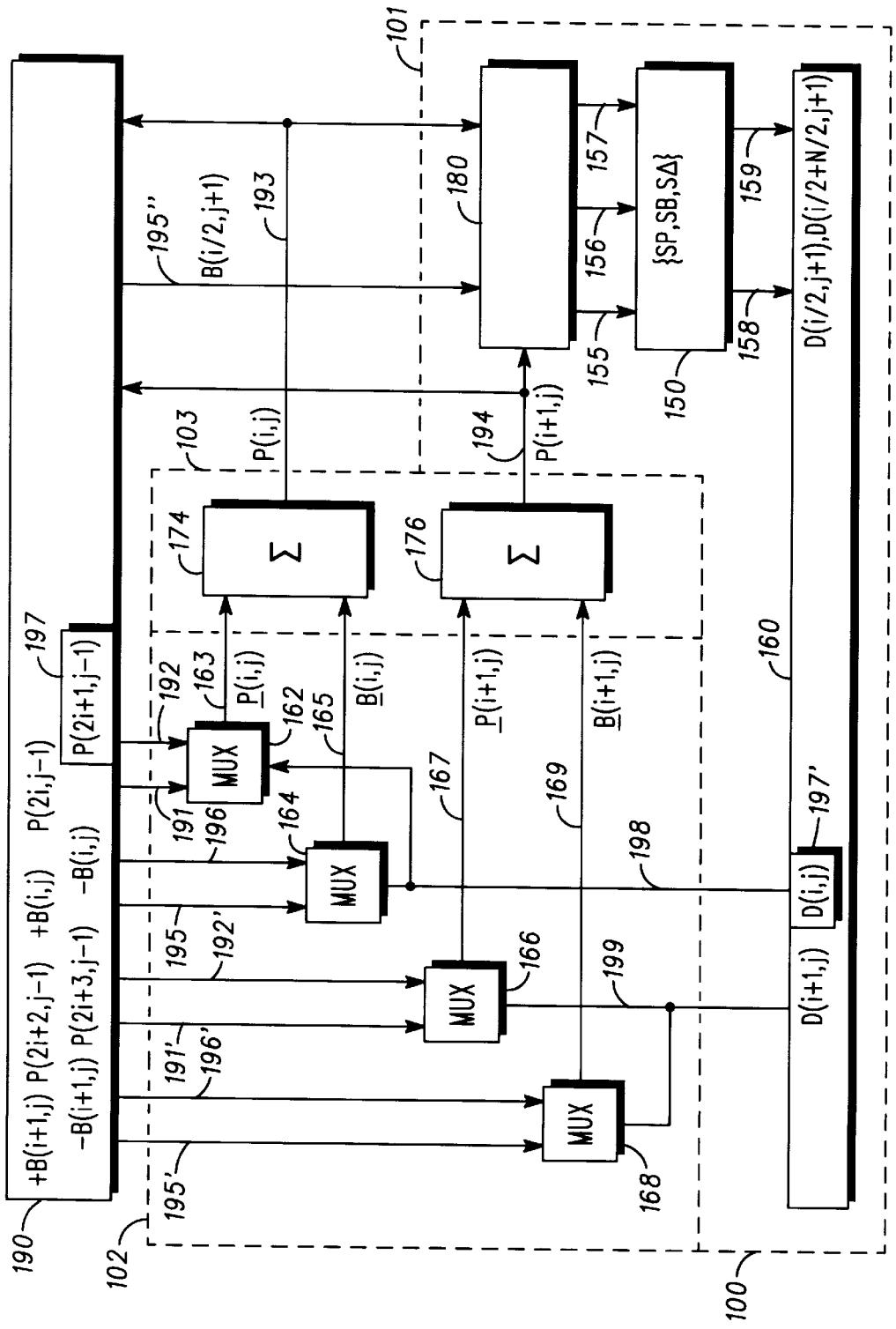
FIG. 7 illustrates a simplified block diagram of an apparatus in a preferred embodiment of the present invention.
Figure 8:
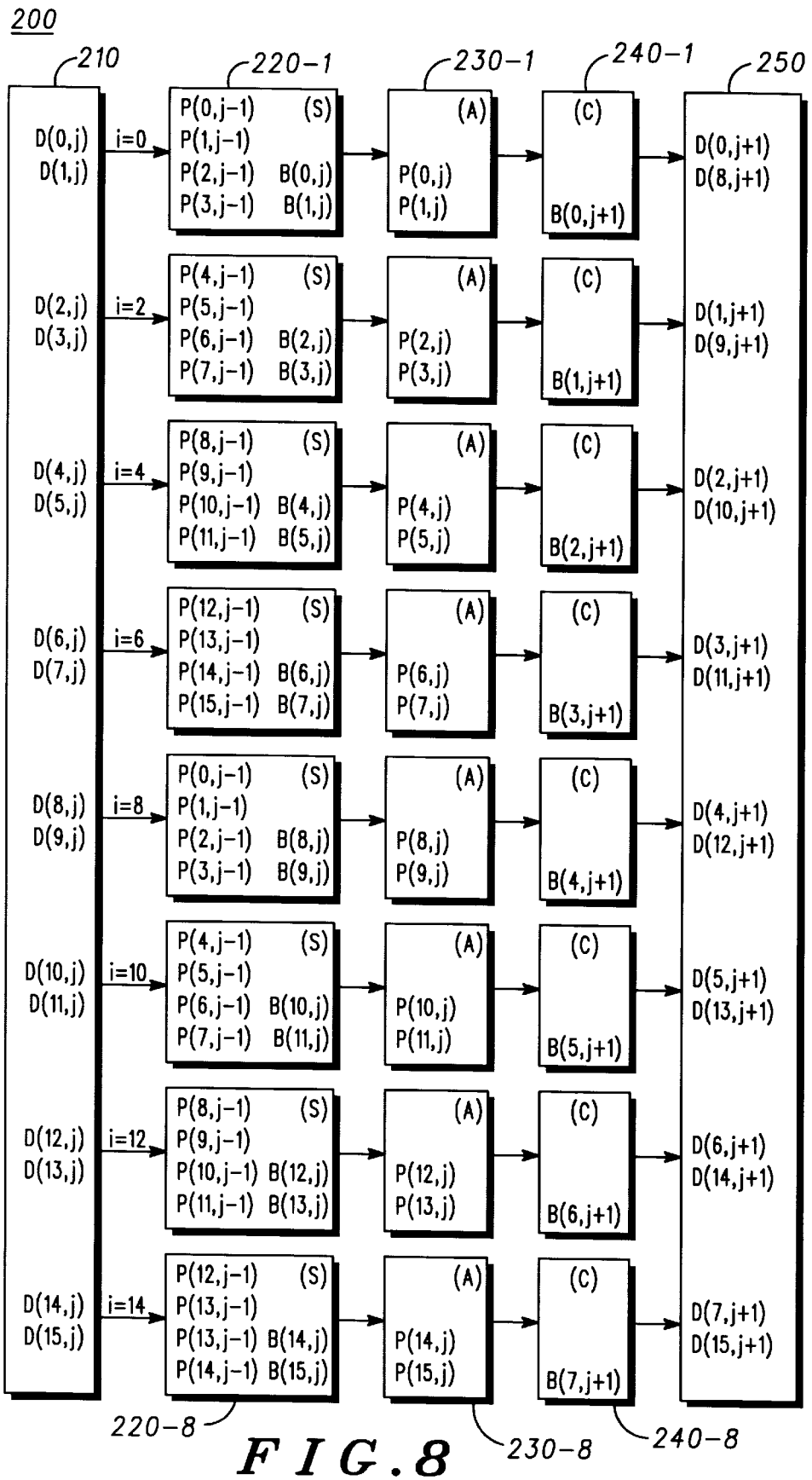
FIG. 8 illustrates a simplified flow diagram of the method of FIG. 3 in the preferred embodiment of the invention.

FIG. 7 illustrates a simplified block diagram of apparatus 100 in a preferred embodiment of the present invention. Apparatus 100 comprises memory 190, decision register 160, multiplexers 162, 164, 166 and 168, adders 174 and 176, as well as logic circuits 180 and 150. As shown in dashed frames, multiplexers 162, 164, 166 and 168 form multiplexer arrangement 102; adders 174 and 176 form adder arrangement 103; and logic circuits 180 and 150 as well as decision register 160 form compare arrangement 101. Arrangements 103, 101, and 102 correspond to the Viterbi steps of adding (A), comparing (C), and selecting (S).

Memory 190 has memory fields 197 for storing path metrics P (n, j−1), P (n, j), branch metrics ±B (n, j), and ±B (n, j+1) for n=0 to N−1. As for example, one memory field 197 is shown for P (2i+1, j−1).

As shown in FIG. 7, memory 190 provides P (2, j−1) at line 191, P (2+1,j−1) at line 192, +B (i, j) at line 195, −B (i, j) at line 196, P(2i+2, j−1) at line 191' P (2+3, j−1) at line 192', +B (i+1, j) at line 195', and −B (i+1,j) at line 196'. Memory 190 receives P (i, j) from line 193 and P (i+1, j) from line 194. A person of skill in the art is able to couple lines unprimed and primed lines 191, 192, 195, 196 to memory fields 197 depending on what metric is used in apparatus 100. Similarly, decision register has fields 197'. Decision register 160 stores decisions D (n, j) and D (n, j+1) for n=0 to N−1. As shown in FIG. 7, decision register 160 provides D (i, j) at line 198 and D (i+1, j) at line 199 and receives D (i, j+1) from line 158 and D (i/2+N/2, j+1) from line 159.

Multiplexer 162 receives P (2, j−1) from line 191, P (2i+1, j−1) from line 192 and D (i, j) from line 198 and provides intermediate path metric P (i, j)=P (2, j−1) for D (i, j)=0 or P (i, j)=P (2i+1, j−1) for D (i, j)=1 to line 163. Multiplexer 164 receives +B (i, j) from line 195, −B (i, j) from line 196 and D (i, j) from line 198 and provides intermediate branch metric B (i, j)=+B (i, j) for D (i, j)=0 or B (i, j)=−B (i, j) for D (i, j)=1 to line 165. The terms "intermediate path or branch metrics" are intended to be synonyms to "selected path or branch metrics" as used in some of the claims.

Multiplexer 166 receives P (2i+2, j−1) from line 191', P (2i+3, j−1) from line 192' and D (i+1, j) from line 199 and provides intermediate path metric P (i+1, j)=P (2i+2, j−1) for D (i+1, j)=0 or P (i+1, j)=P (2i+3, j−1) for D (i+1, j)=1 to line 167. Multiplexer 168 receives +B (i+1, j) from line 195', −B (i+1, j) from line 196' and D (i+1, j) from line 199 and provides intermediate branch metric B (i+1, j)=+B (i+1, j) for D (i+1, j)=0 or B (i+1, j)=−B (i+1, j) for D (i+1, j)=1 to line 169.

Adder 174 receives P (i, j) on line 163 and B (i, j) on line 165 and provides P (i, j)=P (i, j)+B (i, j) to line 193. Adder 176 receives P (i+1, j) on line 167 and B(i+1,j) on line 167 and provides P(i+1, j)=P (i+1, j)+B (i+1, j) to line 194. Logic circuit 180 receives P (i, j) on line 193 and P (i+1, j) on line 194, and new branch metric B (i/2, j+1) at line 195" and provides sign vector {SB, SP, SΔ} at lines 155–157 (see FIG. 6).

Logic circuit 150 receives sign vector {SB, SP, SΔ} and provides D (i/2, j+1) and D (i/2+N/2, j+1) at lines 158 and 159 (see FIG. 6), respectively. An example for logic circuit 150 has been described as logic circuit 150' in connection with FIG. 6. Logic circuit 180 can be any circuit operating as in sub-step 80 of FIG. 4. To fit logic circuit 180 into FIG. 7, the indices of FIG. 4 should be replaced by one time point: "2" to "i" and "j−1" to "j". Logic circuit 150 can be any circuit operating as in sub-step 50 of FIG. 5, such as for example, logic circuit 150' of FIG. 6. To fit logic circuit 150 into FIG. 6, the indices of FIGS. 5–6 should be replaced by one time point: "i" to "i/2" and "j" to "j+1" without departing from the idea of the invention.

Based on the description herein, a person of skill in the art is able to implement apparatus 100 by, for example, using a signal processor with the correct programming. For example, 24-bit digital signal processor DSP56300 developed by Motorola, Inc. is described in [1]: DSP56300, Family Manual, Second Printing, 1995, document number DSP56300FM/AD. A signal processor (e.g., DSP56300) has a random access memory (RAM) as memory 190, accumulator units as adder 172, 174, pointers to the RAM as multiplexers 162, 164, 166, and 168 and lines 191, 192, 195, 196 (also primed), and data busses as e.g., lines 193, 194, 158, 159, 198, and 199. Logic circuits 180 and 150 and decision register 160 can be implemented by additional hardware. For example, in FIG. 3-1 of [1], logic circuits 180 and 150 can be coupled to the Accumulator and Rounding Unit for receiving P (i, j) and P (i+1, j). Logic circuits 180 and 150 can be coupled to decision register 160 having 2*N storage fields for storing { D (n, j) and {D (n, j+1)}. Decision register 160 can communicate {D (n, j)} and {D (n, j+1)} to and from one of data busses X, Y or P. As an example intended for explanation, details for a modified data arithmetic logic unit (DALU) of the DSP56300 of are explained in reference to FIGS. 9–11.

FIG. 8 illustrates a simplified flow diagram of method 200 which is method 20 of FIG. 3 in the preferred embodiment of the invention. Method 200 is applicable for apparatus 100 of FIG. 7. Preferably, method 200 is realized by using individual signal processor instructions well known and documented in the art. The indices n=0 to 15 indicate N=16 states. Even indices i are i=0, 2, 4, 6, 8, 10, 12, and 14. This numbers are intended to be a non-limiting example and have been chosen only for the convenience of explanation. Block 210 shows first decision vector {D (n, j)} which is assumed to be given initially for time point j. The vector components D (n, j) are shown in pairs of D (i,j) and D (i+1, j) as they can be supplied to lines 198 and 199 of apparatus 100. For example, pairs are D (0, j) and D (1, j) (for i=0) or D (2, j) and D (3, j) (for i=2).

Block 250 shows second decision vector {D (n, j+1)} for time point j+1 obtained as a result of method 200. The vector components D (n, j+1) are shown in pairs of D (i/2, j+1) and D (i/2+N/2, j+1) as they are available, for example, on lines 158 and 159 of apparatus 100. Pairs are, for example, D (1, j+1) and D (9, j+1) for i=2. Each of blocks 220-1 to 220-8 represents the step of selecting (S) which can be realized, for example, by multiplexers 162, 164, 166, 168 of apparatus 100.

Blocks 220 show also sub-pluralities {P (2, j−1), P (2i+1, j−1), P (2i+2, j−1), P (2i+3, j−1)} and branch metrics B (i, j) and B (i+1, j) as they are available, for example, on lines 191, 192, 195, 196 (also primed numbers) of apparatus 100. As it can be seen in blocks 220-1 to 220-8, the first plurality of path metrics is divided into N/2=8 sub-pluralities. Elements can be in sub-pluralities twice. For example, P (12, j−1) is shown in block 220-4 for i=6 and in block 220-8 for i=14 (cyclic n: n=2i=2*14=28, 28−16=12). Each of blocks 230-1 to 230-8 represents the step of adding (A) which can be realized by, for example, adder 174 and 176 of apparatus 100. The resulting pairs of P (i, j) and P (i+1, j) (at e.g. lines 193, 194 of 100) are required for the next step and therefore given for convenience. Each of blocks 240-1 to 240-8 represents the step of comparing (C) which can be realized by, for example, logic circuits 180 and 150 of apparatus 100. Blocks 240 also show branch metrics B (i/2, j+1) required for comparing.

According to method 200, a first plurality {P (n, j−1)} of path metrics P (n, j−1) is transformed into a second plurality {P (n, j)} of path metrics P (n, j) by the following steps:

A first decision vector {D (n, j)} is provided (block 210). The first plurality P (n, j−1)} is divided into sub-pluralities, with for example, 4 components P (2, j−1), P (2i+1, j−1), P (2i+2, j−1), P (2i+3, j−1). First and second branch metrics, e.g., B (i, j) and B (i+1, j) are received. First and second intermediate path metrics P (i, j) and P (i+1, j) are selected (S) from {P (n, j−1)} and first and second intermediate branch metrics B (i, j) and B (i+1, j) according to {D (n, j)}. B (i, j) and B (i+1, j), each are either positive ("+") or negative ("−") representations of B (i, j) and B (i+1, j). P (i, j) and B (i, j) as well as P (i+1, j) and B (i+1, j) are added to path metrics P (i, j) and P (i+1, j) of {P (n, j)}. A third branch metric B (i/2, j+1) is received and compared (C) with P (i, j) and P (i+1, j) of {P (n, j) }. Thereby, components D (i/2, j+1) and D (i/2+N/2, j+1) of a second decision vector {D (n, j+1)} are provided.

In the example of FIG. 8, sub-plurality {P (0, j−1), P (1, j−1), P (2, j−1), P (3, j−1)}, branch metrics B (0, j) and B (1, j) (block 220-1) and decisions D (0, j) and D (1, j) (block 210) give P (0, j) and P (1, j) (block 230-1). Comparing (block 240-1) using B (0, j+1) gives decisions D (0, j+1) and D (8, j+1) (block 250). The cycle is also performed for all other blocks 220/230/240-2 to 8.

Having obtained new {D (i, j+1)} for all i (block 250), old {D (2, j)} can be discarded. Preferably, in decision register 160, D (n, j+1) move into fields 197' of old D (n, j−1). A continuation can be followed in FIG. 8 by advancing the time point. Index "j−1" is replaced by "j" and "j" is replaced by "j+1". The second plurality {P (n, j)} is cyclically divided into sub-pluralities, e.g., P (i, j), P (i+1, j), P (i+2, j), P (i+3, j). For each sub-plurality, third and fourth branch metrics B (i/2, j+1) and B (i/2+1, j+1) are read. Third and fourth intermediate path metrics P (i/2, j+1) and P (i/2+1, j+1) are selected from {P (n, j)} and third and fourth intermediate branch metrics B (i/2, j+1)=±B (i/2, j+1) and B (i/2+1, j+1)=+B (i/2+1, j+1) (according to {D (n, j+1)}). By adding, P (i/2, j+1)+B (i/2, j+1) and P (i/2+1, j+1)+B (i/2, j+1), path metrics P (i/2, j+1) and P (i/2+1, j+1), respectively, path metrics of a third plurality {P (n, j+1)} are provided. Upon receiving, a fifth branch metric B (i/4, j+2) and comparing the components of a third decision vector {D (n, j+2)} are obtained.

Preferably, {P (n, j−1)} and {P (n, j)} are stored in memory 190 independently on different locations. {P (n, j+1) can replace P (n, j−1)} so that only N*2 memory fields 197 are required. In the steps of selecting, a first pointer (e.g., lines 191, 192, multiplexer 162) for P (i) (e.g., j−1, j or j+1) points to one path metric (e.g., to P (i)) of a first metric pair e.g., P (i) and P (i+1) and a second pointer (e.g., lines 191', 192', multiplexer 166) for P (i+1) points to one path metric (e.g., to P (i+2)) of a second, adjacent metric pair P (i+2) and P (i+3).

A third pointer (e.g., line 195, 196, multiplexer 164) points to ±B (i, j) and determines the sign ("+" or "−" ) by which B (i, j) is used as B (i, j). Similarly, a fourth pointer (e.g., line 195', 196', multiplexer 168) determines B (i+1, j). The steps of reading, selecting, adding, receiving and comparing (see blocks 220, 230, 240) can be performed simultaneously for one or more sub-plurality. In that case, apparatus 100 should have additional multiplexers, adders, and logic circuits. Preferably, the steps of reading, selecting, adding, receiving and comparing are performed consecutively for each sub-pluralities. As shown in the example of FIG. 8, method 200 can be performed for blocks 220-1, 230-2, 240-1, 220-2, 230-2 and so on to 240-8. When method 200 is performed the first time, such as for example when apparatus 100 is being switched on, decision register 160 has not received new entries. In that case, first decision vector {D (n, j−1)} has preferably, equal entries D (n, j−1)=0 or D (n, j−1)=1 for all n. Realized in e.g., logic circuit 180, the step of comparing (C) has the sub-steps of forming a first difference P (i, j)−P (i+1, j) having first sign SP, forming a second difference |P (i, j)−P (i+1, j)|−2*|B (i/2, j+1)| with B (i/2, j+1) having second sign SB, and |P (i, j)−P (i+1, j)|−2*|B (i/2, j+1)| having third sign SΔ, and relating SP, SB, and SΔ to a first decision D (i/2, j+1) and to a second decision D (i/2+N/2, j+1), each of it having logical values e.g., "0" or "1".

Figure 9:
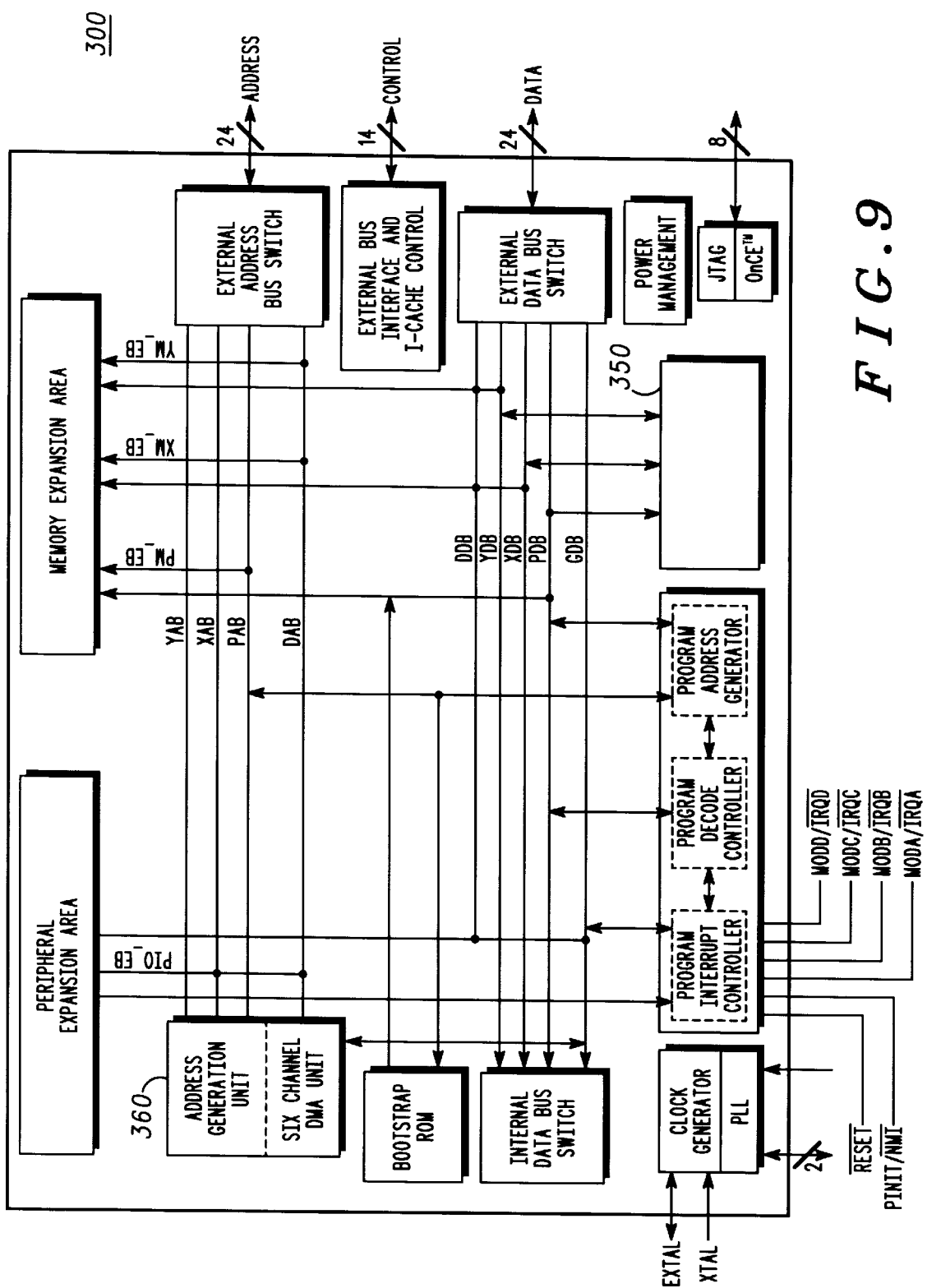
FIG. 9 illustrates a simplified block diagram of a system in a further preferred embodiment of the present invention.

FIG. 9 illustrates a simplified block diagram of system 300 in a further preferred embodiment of the present invention. As cited hereinafter, system 300 is a digital signal 10 processor, such as e.g., the DSP56300 having a modified data arithmetic logic unit 350 (hereinafter MDALU 350) and modified address generator unit 360 (hereinafter MAGU 360). FIG. 9 is based on FIG. 1-1 of [1] having elements described in detail in section 3.1 of [1]. System 300 is intended to give an example for explanation by illustrating a further preferred embodiment of the present invention. A person of skill in the art applying the description herein is able to implement the present invention by other means on signal processors similar to e.g., the DSP56300.

Figure 10:
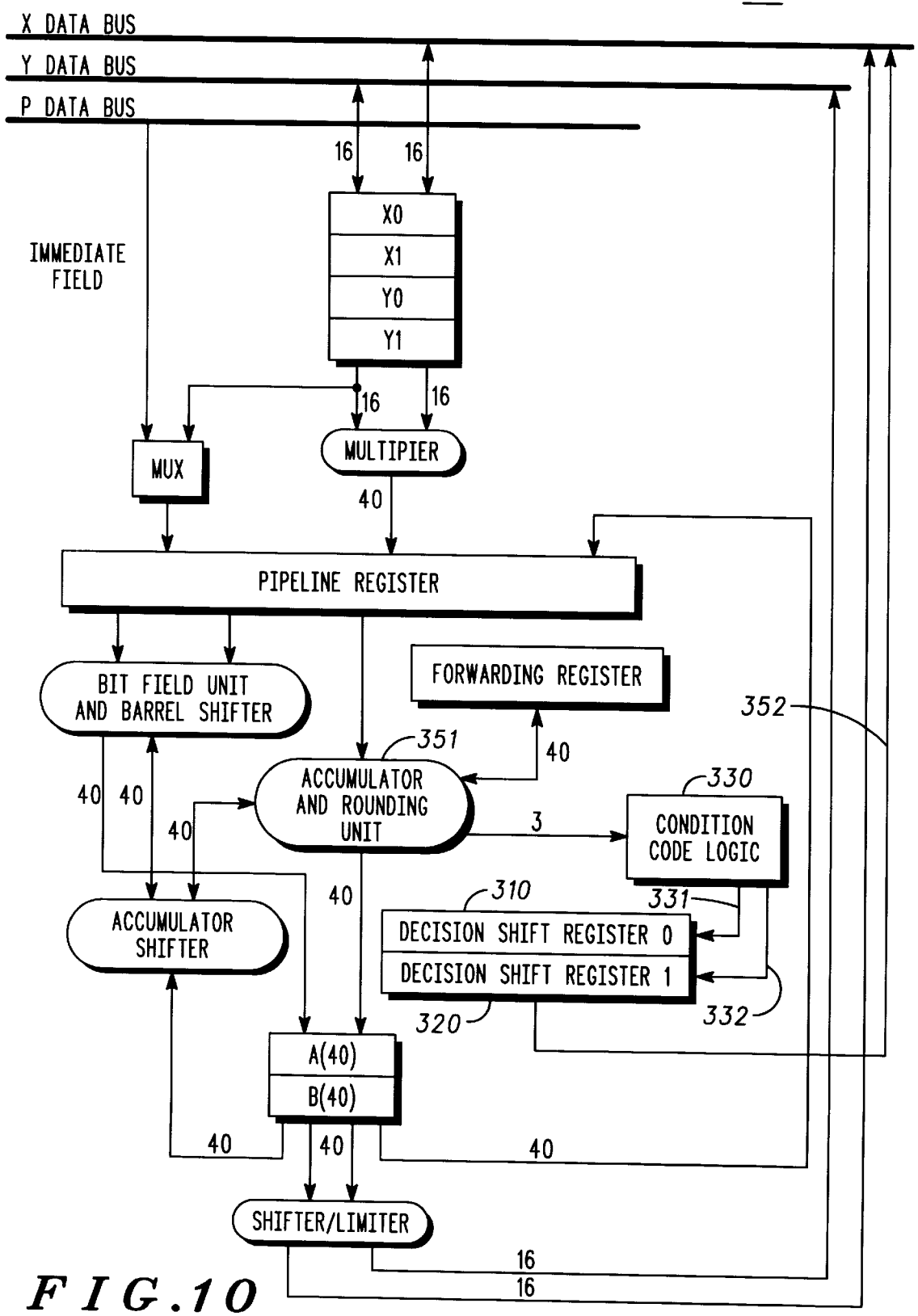
FIG. 10 illustrates a simplified block diagram of a modified data arithmetic logic unit of the system of FIG. 8.

FIG. 10 illustrates a simplified block diagram of MDALU 350 of system 300 of FIG. 9. FIG. 10 is based on FIG. 3-1 of [1] having elements described in detail in section 3.1 of [1]. MDALU 350 has the elements shown in FIG. 3-1, additional condition code logic 330 and additional decision shift registers 310 and 320 (hereinafter shift register(s)).

Condition code logic 350 is coupled to accumulator and rounding unit 351 (see [1]). Unit 351 is an implementation of adder 174 and 176 of FIG. 7 providing P (i, j) and P (i+1, j). Unit 351 is coupled to condition code logic 330 for providing D (i/2, j+1) and D (i/2+N/2, j+1). Condition code logic 330 is coupled to shift register 310 by line 331, for consequently storing D (i/2, j+1) for e.g., i/2=0, 1, 2, 3, 4, 5, 6, and 7. (illustrated in FIG. 8 by block 240-1 to 240-8). Similarly, condition code logic 330 is coupled to shift register 320 by line 332 for consequently storing D (i/2+N/2, j+1) for e.g., i/2+N/2=9, 10, 11, 12, 13, 14, and 15. Preferably, shift registers 310 and 320 are coupled to the data bus by bus 352 to deliver decisions in parallel. For example, for i=0, shift registers 310 and 320 provide decisions D (0, j) and D (8, j) to the data bus. Than, shift registers 310 and 320 delivers D (1, j) and D (9, j), and so on.

Figure 11:
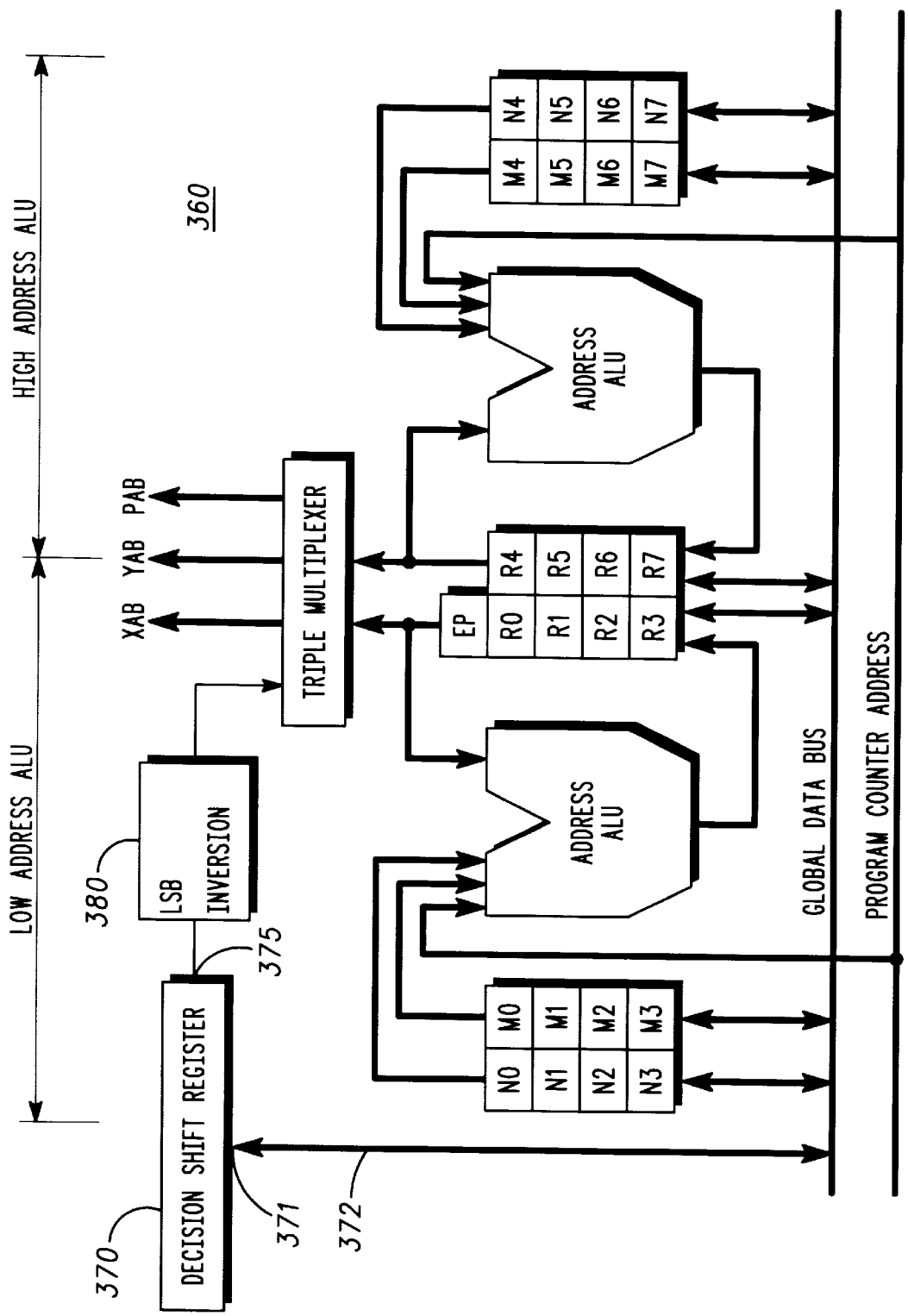
FIG. 11 illustrates a simplified block diagram of a modified address generator unit of the system of FIG. 8.

FIG. 11 illustrates a simplified block diagram of MAGU 360 of system 300 of FIG. 9. FIG. 11 is based on FIG. 4-1 of [1] having elements described in detail in section 4.1 of [1]. MAGU 360 has the elements shown in FIG. 4-1, additional decision shift register 370 (hereinafter shift register 370) and LSB-inverter 380. Shift register 370 has inputs 371 coupled to the global data bus by bus 372 and has output 375 coupled to LSB-inverter 380. LSB-inverter is coupled to the triple multiplexer. Shift register 370 is a buffer which receives and stores, e.g., 16 bits of decisions D (0, j) to D (15, j) and D (i, j) in parallel. Shift register 370 can provide to output 375 simultaneously 2 bits (e.g., D (0, j) and D (1, j)) from these 16 bits.

Preferably, output 375 provides an "even" bit (e.g., D (0, j) ) and an "odd" bit (e.g., D (1, j) ). After shifting (referred to by "DRS") by 2 positions, the even bit is e.g., D (2, j) ) and the odd bit is e.g., D (3, j).

Method 200 of the present invention is now presented by a series of assembly instructions for system 300. The instructions written in boldface are described in appendix A ("instruction set") of [1]. Registers X0, X1, A, B are general purpose registers. The abbreviations r0, r1, r2, r3, r4, and r5 stand for address pointers and (r0), (r1), (r2), (r3), (r4), and (r5) stand for the metrics referenced by these pointers.

In shift register 370, an even address controls (r0) and (r2) and an odd address controls (r1) and (r3). Abbreviations N0, N1, N2, and N3 are syntax elements of the use assembly language and not essential for the present invention. In the example, they are N0=4, N1=4, N2=4, and N3=4. Instructions, DRS and CMPV are newly proposed in connection with shift registers 310 and 320.

Pointer r0 points to path metrics (r0)=P (2, j−1) or (r0)=P (2i+1, j−1) according to an even bit of the decision register 370. Pointer r1 points to path metrics (r1)=P (2i+2, j−1) or to (r1)=P (2i+3, j−1) according to an odd bit of the decision register 370. Pointer r2 points to branch metrics B (i, j) or −B (i, j) according to an even bit of decision register 370. Pointer r3 points to branch metrics B (i+1, j) or −B (i+1, j) according to the odd bit of decision register 370. Pointer r4 points to new path metric P (i, j). Pointer r5 points to new branch metric B (i/2, j+1).

Start conditions are: Accumulator A either stores P (2, j−1) or P (2i+1, j−1). Accumulator B stores P (i−1, j). Register X0 stores ±B (i, j). Register X1 stores ±B (i+1, j). Register Y1 stores B (i/2−1, j+1). The following assembly language program has comments in {}.

| {1st command} | |
|---|---|
| ADD X0, A | {calculating P (i, j)} |
| X: (r1) + N1, B | {Depending on D (i + 1, j), writing P (2i + 2, j − 1) or P (2i + 3, j − 1) into register B} |
| DRS | {shifting decision register 370 by two positions} |
| {2nd command} | |
| ADD X1, B | {calculating P (i + 1, j)} |
| X: (r2) + N2, X0 | {depending on D(i + 2, j), writing ±B (i + 2, j) into register X0} |
| Y: (r5) +, Y1 | {writing B(i/2, j + 1) into register Y1} |
| CMPV Y1, A | {calculating new decisions D (i/2, j + 1) and D (i/2 + N/2, j + 1) by condition code logic, and writing them into registers 310, 320} |
| X: (r0) + N0, A | {depending on D(i + 2, j), writing P(2i + 4, j − 1) or P(2i + 5, j − 1) into register A} |
| B, Y: (r4)+ | {storing P(i + 1, j) from register B into memory as referenced by pointer r4} |

At the end, accumulator A stores either P(2i+4, j−1) or P(2i+5, j−1). Accumulator B stores P(i+1, j). Register X0 stores +B (i+2, j). Register X1 stores ±B (i+3, j). Register Y1 stores B (i/2, j+1).

Having introduced the present invention, a general description is given in other words. The present invention describes a system for performing a Viterbi algorithm (e.g., apparatus 100 of FIG. 7) having the steps of adding (A), comparing (C), and selecting (S) of branch metrics (e.g., B (i, j)) and path metrics (e.g., P (2, j−1), P (2i+1, j−1), P (i/2i+2, j−1), P (2i+3, j−1)). The system characterized in that the comparing step (C) is anticipated by the selecting and adding steps.

When comparing (C), the system (e.g., apparatus 100)) of the present invention relates a first and a second path metric (e.g., P (i, j) and P (i+1, j)) and a branch metric (e.g., B (i/2, j+1)) to a sign vector {SP, SB, SΔ} with components SP, SB, SΔ. The components are related to a decision vector, e.g., {D (i/2, j+1); D (i/2+N/2, j+1)} which is used to select (S) which one of the first and second path metric is selected to be added to the branch metric.

The present invention describes a system for performing a Viterbi algorithm which receives in a cycle a first plurality of path metrics (with e.g., P (2i, j−1) on line 191, P (2i+1, j−1) on line 192), a second plurality of branch metrics (with e.g., ±B (i, j) on lines 195, 196) and a third plurality of branch metrics (with e.g., B (i/2, j+1) on line 195"). The system (e.g., apparatus 100) comprises multiplexer arrangement 102 operating on a plurality of decisions (with e.g., D (i, j), D (i+1, j), in decision register 160) and cyclically (e.g., for increasing i) selecting (by e.g., multiplexer 163) a fourth plurality of path metrics (with e.g., P (i, j) on line 163) from the first plurality and a fifth plurality of branch metrics (with e.g., B (i, j) on line 165) from the second plurality. The system further comprises adder arrangement 103 for adding path metrics of the fourth plurality to branch metrics of the fifth plurality (adders 174, 176), and thereby providing a sixth plurality of path metrics (e.g., with P (i, j) at line 193). The system further comprises compare arrangement 101 which receives the sixth plurality of path metrics (e.g., with P (i, j)) and the third plurality of branch metrics (with e.g., B (i/2, j+1)) for updating said plurality of decisions. so that in a repeated cycle (when j increases), multiplexer arrangement 102 operates on the updated plurality of decisions (with e.g., D (i+1, j), D (i, j) at lines 198, 199).

The system of the present invention further comprises a first memory (e.g., memory 190) cyclically storing the sixth plurality of path metrics (with e.g., P (i, j) at line 193) which becomes the first plurality in further cycles. The system of the present invention further comprises a second memory (e.g., decision register 160) in which the plurality of decisions are cyclically stored.

The system of the present invention as introduced in FIG. 7, can be implemented as a digital signal processor (such as e.g., the DSP56300) which has an address generator in the function of multiplexer arrangement 102, a data arithmetic logic in the function of adder arrangement 103, condition code logic 330, and first and second decision registers 310 and 320 in the function of the compare arrangement 101.

Compare arrangement 101 can comprise a first logic circuit (e.g., logic circuit 180) and a second logic circuit (e.g., logic circuit 150). The first logic circuit receives the third plurality of branch metrics (e.g., on lines 195") and the sixth plurality of path metrics (e.g., on lines 193, 194) and provides a sign vector (e.g., {SP, SB, SD } at lines 155, 156, and 157). The second logic circuit combines the components SP, SB, SD to the plurality of decisions (e.g., D (i/2, j+1), D (i/2+N/2, j+1)).

While the invention has been described in terms of particular steps and devices those of skill in the art will understand based on the description herein that it is not limited merely to such examples and that the full scope of the invention is properly determined by the claims that follow.

We claim:

1. A method for implementing Viterbi butterflies with the steps of adding, comparing, and selecting, characterized in that the step of comparing is anticipated before the steps of selecting and adding and that:

in said step of comparing, a first path metric P (2i, j−1), a second path metric P (2i+1, j−1) and a branch metric+B (i, j) are related to a sign vector {SP, SB, SΔ} and components SP, SB, SΔ of said sign vector {SP, SB, SΔ} are related to a binary decision vector {D (i, j), D (i+N/2, j)} having first component D (i, j) and second component D (i+N/2, j);

in said step of selecting, a first intermediate path metric P (i, j) is selected from P (2i, j−1) and P (2i+1, j−1) according to D (i, j), a second intermediate path metric P (i+N/2, j) is selected from P (2i, j−1) and P (2i+1, j−1) according to D (i+N/2, j), a first intermediate branch metric B1 (i, j) is selected from +B (i, j) and an inversion−B (i, j) of +B (i, j), and a second intermediate branch metric B2 (i, j) is selected from +B (i, j) and −B (i, j);

in said step of adding, P (i, j) and B1 (i, j) are added to third path metric P (i, j)=P (i, j) +B1 (i, j), and P (i+N/2, j) and B2 (i, j) are added to fourth path metric P (i+N/2, j)=P (i+N/2, j) +B2 (i, j).

2. The method of claim 1, wherein in said step of comparing, said component of said sign vector {SP, SB, SΔ} are a first sign SP=+1 for (P(i, j−1) −P (i+1, j−1)) >0 and SP=−1 for (P(i, j−1) −P(i+1, j−1)) <0, a second sign SB=+1 for B (i, j) >0 and SB=−1 for B (i, j) <0, a third sign SΔ=+1 for |P(i, j−1) −P(i+1, j−1) |−2*|B (i, j) |>0 and SΔ=−1 for |P(i, j−1) −P(i+1, j−1) |−2* |B (i, j) >0, and wherein said binary decision vector {D(i, j), D(i+N/2, j) } is obtained according to:

| SP | SB | SΔ | D(i, j) | D(i + N/2, j) |
|----|----|----|---------|---------------|
| +1 | +1 | +1 | 0 | 0 |
| +1 | +1 | −1 |   | 1 |
| +1 | −1 | +1 | 0 | 0 |
| +1 | −1 | −1 | 1 |   |
| −1 | +1 | +1 | 1 | 1 |
| −1 | +1 | −1 | 0 |   |
| −1 | −1 | +1 | 1 | 1 |
| −1 | −1 | −1 |   | 0 |

3. The method of claim 1 wherein in said step of selecting,

P (2i, j−1) is selected as said first intermediate path metric P (i, j) for D (i, j)=0 or P (2i+1, j−1) is selected as said first intermediate path metric P (i, j) for D (i, j)=1, P (2i, j−1) is selected as said second intermediate path metric P (i+N/2, j) for D (i+N/2, j)=0 or P (2i+1, j−1) is selected as said second intermediate path metric P (i+N/2, j) for D (i+N/2, j)=1, +B (i, j) is selected as said first intermediate branch metric B1 (i, j) for D (i, j)=0 or −B (i, j) is selected as said first intermediate branch metric B1 (i, j) for D (i, j)=1, and +B (i, j) is selected as said second intermediate branch metric B2 (i, j) for D (i+N/2, j)=0 or −B (i, j) is selected as said second intermediate branch metric B2 (i, j) for D (i+N/2, j)=1.

4. The method of claim 1 wherein in said step of selecting, said first intermediate path metric P (i, j) becomes P (2i, j−1) for D (i, j)=0 or becomes P (i, j)=P(2i+1, j−1) for D(i, j)=1, said second intermediate path metric P (i+N/2, j) becomes P (2i, j−1) for D (i+N/2, j)=0 or becomes P (i+N/2, j)=P (2i+1, j−1) for D (i+N/2, j)=1, said first intermediate branch metric B1 (i, j) becomes B1 (i, j)=+B (i, j) for D (i, j)=0 or becomes B1 (i, j)=−B (i, j) for D (i, j)=1, and said second intermediate branch metric B2 (i, j) becomes B2 (i, j)=+B (i, j) for D (i+N/2, j)=0 or becomes B2 (i, j)=−B (i, j) for D (i+N/2, j)=1.

5. The method of claim 1 wherein in said step of comparing, said binary decision vector {D (i, j), D (i+N/2, j) } is stored.

6. An apparatus for implementing Viterbi butterflies, said apparatus performing the steps of adding, comparing, and selecting, characterized in that said apparatus performs said step of comparing prior to performing said steps of selecting and adding and that:

in said step of comparing, said apparatus relates a first path metric P (2i, j−1), a second path metric P (2i+1, j−1) and a branch metric +B (i, j) to a sign vector {SP, SB, SΔ}, said apparatus relates said components SP, SB, SΔ of said sign vector {SP, SB, SΔ} to a binary decision vector {D (i, j), D (i+N/2, j) } having first component D (i, j) and second component D (i+N/2, j);

in said step of selecting, said apparatus selects a first intermediate path metric P (i, j) from P (2i, j−1) and P (2i+1, j−1) according to D (i, j), selects a second intermediate path metric P (i+N/2, j) from P (2i, j−1) and P (2i+1, j−1) according to D (i+N/2, j), selects a first intermediate branch metric B1 (i, j) from +B (i, j) and an inversion −B (i, j) of +B (i, j), and selects a second intermediate branch metric B2 (i, j) from +B (i, j) and −B (i, j);

in said step of adding, said apparatus adds P (i, j) and B1 (i, j) to third path metric P (i, j)=P (i, j) +B1 (i, j), and adds P (i+N/2, j) and B2 (i, j) to fourth path metric P (i+N/2, j)=P (i+N/2, j) +B2 (i, j).

7. The apparatus of claim 6, wherein said apparatus provides said component of said sign vector {SP, SB, SΔ} as a first sign SP=+1 for (P(i, j−1) −P (i+1, j−1)) >0 and SP=−1 for (P(i, j−1) −P(i+1, j−1)) <0, a second sign SB=+1 for B (i, j) >0 and SB=−1 for B (i, j) <0, a third sign SΔ=+1 for |P(i, j−1) −P(i+1, j−1) |−2* |B (i, j) |>0 and SΔ=−1 for |P(i, j−1) −P(i+1, j−1) |−2* |B (i, j) >0, and wherein said apparatus obtains said binary decision vector {D (i, j), D(i+N/2, j) } according to:

| SP | SB | SΔ | D(i, j) | D(i + N/2, j) |
|----|----|----|---------|---------------|
| +1 | +1 | +1 | 0       | 0             |
| +1 | +1 | −1 |         | 1             |
| +1 | −1 | +1 | 0       | 0             |
| +1 | −1 | −1 | 1       |               |
| −1 | +1 | +1 | 1       | 1             |
| −1 | +1 | −1 | 0       |               |
| −1 | −1 | +1 | 1       | 1             |
| −1 | −1 | −1 |         | 0             |

8. The apparatus of claim 6 which in said step of selecting, selects P (2i, j−1) as said first intermediate path metric P (i, j) for D (i, j)=0 or selects P (2i+1, j−1) as said first intermediate path metric P (i, j) for D (i, j)=1, selects P (2i, j−1) as said second intermediate path metric P (i+N/2, j) for D (i+N/2, j)=0 or selects P (2i+1, j−1) as said second intermediate path metric P (i+N/2, j) for D (i+N/2, j)=1, selects +B (i, j) as said first intermediate branch metric B1 (i, j) for D (i, j)=0 or selects −B (i, j) as said first intermediate branch metric B1 (i, j) for D (i, j)=1, and selects +B (i, j) as said second intermediate branch metric B2 (i, j) for D (i+N/2, j)=0 or selects −B (i, j) as said second intermediate branch metric B2 (i, j) for D (i+N/2, j)=1.

9. The apparatus of claim 6 which in said step of comparing, stores said binary decision vector {D (i, j), D (i+N/2, j) }.

10. The apparatus of claim 6 which in said step of comparing, stores said binary decision vector {D (i, j), D (i+N/2, j) } so that said binary decision vector becomes available for a new cycle.

11. A method for transforming a first plurality of path metrics into a second plurality of path metrics, said method comprising the steps of:

providing a first decision vector; and cyclically dividing said first plurality of path metrics into sub-pluralities of at least a first path metric, a second path metric, a third path metric, and a fourth path metric, thereby receiving a first branch metric and a second branch metric, selecting substantially simultaneously according to said first decision vector, (a) a first intermediate branch metric which is either a positive representation of said first branch metric or a negative representation of said first branch metric, (b) a second intermediate branch metric which is either a positive representation of said second branch metric or a negative representation of said second branch metric, (c) a first intermediate path metric which is either said first path metric or said second path metric, and (d) a second intermediate path metric which is either said third path metric of said fourth path metric, adding said first intermediate path metric and said first intermediate branch metric and adding said second intermediate path metric and said second intermediate branch metric, thereby providing said path metrics or said second plurality, and receiving a third branch metric and comparing said third branch metric with said path metrics of said second plurality, thereby providing a second decision vector, which in repetitions of said method updates said first decision vector.

12. The method of claim 11 further comprising the step of cyclically dividing said second plurality into sub-pluralities, thereby for each sub-plurality reading third and fourth branch metrics, selecting third and fourth intermediate path metrics from said second plurality and third and fourth intermediate branch metrics according to said second decision vector, said intermediate branch metrics each being either positive or negative representations of said third and fourth branch metrics, adding said third intermediate path and branch metrics and adding said fourth intermediate path and branch metrics, thereby providing said path metrics of a third plurality of path metrics, and receiving a fifth branch metric and comparing said fifth branch metric with said path metrics of said third plurality, thereby providing a third decision vector.

13. The method of claim 11 wherein said first and second plurality of path metrics are stored independently.

14. The method of claim 11 wherein in said step of selecting, a first pointer for said first intermediate path metric points to one path metric of a first metric pair formed by said first path metric and said second path metric of said first plurality and wherein a second pointer for said second intermediate path metric points to one path metric of a second, adjacent metric pair formed by said third path metric and said fourth path metric of said first plurality.

15. The method of claim 11 wherein in said step of selecting, a third pointer points to said first branch metric and determines the sign by which said first branch metric is used as said first intermediate branch metric and wherein a fourth pointer points to said second branch metric and determines the sign by which said second branch metric is used as said second intermediate branch metric.

16. The method of claim 11 wherein said steps of reading, selecting, adding, receiving and comparing are performed simultaneously for one or more of said sub-pluralities.

17. The method of claim 11 wherein said steps of reading, selecting, adding, receiving and comparing are performed consecutively for each sub-pluralities.

18. The method of claim 11 wherein in said step of providing a first decision vector, said decision vector has equal components.

19. The method of claim 11 wherein said step of comparing has the sub-steps of:

forming a first difference between a first path metric and a second path metric of said second plurality, said first difference having a first sign;

forming a second difference between the value of said first difference and the twofold of the value of said third branch metric, said third branch metric having a second sign, said second difference having a third sign; and relating said first, second, and third signs to a first decision and to a second decision, said first and second decisions each having binary logical values.

* * * * *

UNITED STATES PATENT AND TRADEMARK OFFICE
CERTIFICATE OF CORRECTION

PATENT NO. : 6,257,756 B1
DATED : July 10, 2001
INVENTOR(S) : Zarubinsky et al.

It is certified that error appears in the above-identified patent and that said Letters Patent is hereby corrected as shown below:

<u>Column 13, claim 1,</u>
Line 37, change "metric+B" to -- metric +B --
Line 42, change "metric P" to -- metric P --
Line 45, change "P(i+N/2,j)" to -- P(i+N/2,j) --
Line 47, change "metric B1" to -- metric B1 --
Line 48, change "inversion-B" to -- inversion -- -B --
Line 49, change "metric B2" to -- metric B2 --
Line 51, change "p (i, j) and B1" to -- P (i, j) and B1 --
Line 52, change "=P(l, j) +B1" to -- P(i, j) +B1 --
Line 53, change "and B2" to -- and B2 --
Line 54, change "+B2" to -- +B2 --

<u>Column 14, claim 3,</u>
Line 15, change "P (i, j)" to -- P (i, j) --
Lines 17 and 19, change "metric P" to -- metric P --
Line 22, change "P (i+N/2, j)" to -- P (i+N/2, j) --
Lines 25 and 27, change "B1" to -- B1 --
Lines 29 and 31, change "metric B2" to -- metric B2 --

<u>Column 14, claim 4,</u>
Line 34, change "metric P" to -- metric P --
Lines 34 and 35, change "becomes P" to -- becomes P --
Line 37, change "metric P" to -- metric P --
Line 38, change "becomes P" to -- becomes P --
Line 40, change "metric B1 (i, j)" to -- metric B1 (I, j) --
Lines 40 and 41, change "becomes B1" to -- becomes B1 --
Line 43, change "metric B2" to -- metric B2 --
Line 44, change "B2 (i,j)" to -- B2 (i,j) --
Line 44, change "becomes B2" to -- becomes B2 --

<u>Column 14, claim 6,</u>
Line 66, change "metric P" to -- metric P --

<u>Column 15, claim 6,</u>
Line 1, change "metric P" to -- metric P --
Line 3, change "metric B1" to -- metric B1 --
Line 5, change "metric B2" to -- metric B2 --
Line 7, change "adds P" to -- adds P --
Line 8, change "B1 (i, j)" to -- B1 (i, j) --
Line 8, change "P (i, j)=P (i, j) +B1" to -- P (i, j)=P (i, j) +B1 --
Line 9, change "B2 (i, j)" to -- B2 (i, j) --
Line 10, change "B2 (i, j)" to -- B2 (i, j) --

UNITED STATES PATENT AND TRADEMARK OFFICE
CERTIFICATE OF CORRECTION

PATENT NO. : 6,257,756 B1
DATED : July 10, 2001
INVENTOR(S) : Zarubinsky et al.

It is certified that error appears in the above-identified patent and that said Letters Patent is hereby corrected as shown below:

<u>Column 15, claim 8,</u>
Line 36, change "metric P" to -- metric $\underline{P}$ --
Line 39, change "P (i, j)" to -- $\underline{P}$ (i, j) --
Line 41, change "P (i+N/2, j)" to -- $\underline{P}$ (i+N/2, j) --
Line 42, change "P (i+N/2, j)" to -- $\underline{P}$ (i+N/2, j) --
Lines 44 and 46, change "metric B1" to -- metric $\underline{B1}$ --
Lines 50 and 52, change "B2 (i, j)" to -- $\underline{B2}$ (i, j) --

Signed and Sealed this

Nineteenth Day of March, 2002

Attest:

*Attesting Officer*

JAMES E. ROGAN
*Director of the United States Patent and Trademark Office*